United States Patent
Nagano et al.

(10) Patent No.: US 7,432,590 B2
(45) Date of Patent: Oct. 7, 2008

(54) CERAMIC PACKAGE, ASSEMBLED SUBSTRATE, AND MANUFACTURING METHOD THEREFOR

(75) Inventors: Natsuyo Nagano, Osaka (JP); Takashi Ogura, Kyoto (JP); Masanori Hongo, Osaka (JP); Masami Fukuyama, Osaka (JP)

(73) Assignee: Sanyo Electric Co., Ltd, Osaka (JP)

( * ) Notice: Subject to any disclaimer, the term of this patent is extended or adjusted under 35 U.S.C. 154(b) by 65 days.

(21) Appl. No.: 11/198,135

(22) Filed: Aug. 8, 2005

(65) Prior Publication Data
US 2006/0033200 A1    Feb. 16, 2006

(30) Foreign Application Priority Data
Aug. 11, 2004    (JP)    ............................. 2004-234590

(51) Int. Cl.
  *H01L 23/12*    (2006.01)
  *H01L 23/48*    (2006.01)
(52) U.S. Cl. .................... 257/704; 257/701; 257/783; 257/E23.181
(58) Field of Classification Search ................ 257/701, 257/704, 783, 784, E23.181
  See application file for complete search history.

(56) References Cited

U.S. PATENT DOCUMENTS

| | | | | |
|---|---|---|---|---|
| 4,626,960 A | * | 12/1986 | Hamano et al. | ............. 361/708 |
| 4,926,240 A | * | 5/1990 | Regione | ..................... 257/783 |
| 5,091,772 A | * | 2/1992 | Kohara et al. | ............... 257/692 |
| 5,168,344 A | * | 12/1992 | Ehlert et al. | ................. 257/693 |
| 5,901,050 A | * | 5/1999 | Imai | ........................... 361/820 |

FOREIGN PATENT DOCUMENTS

| | | | | |
|---|---|---|---|---|
| JP | 362179748 | * | 8/1987 | ...................... 23/2 |
| JP | 10-335964 | | 12/1998 | |

\* cited by examiner

*Primary Examiner*—Nitin Parekh
(74) *Attorney, Agent, or Firm*—Westerman, Hattori, Daniels & Adrian, LLP.

(57) ABSTRACT

In a ceramic package including one or more ceramic layers and being capable of having an electronic component and a lid fixed to a surface thereof, a surface of a ceramic layer having a sealing electrode for joining the lid through a sealing member and a pad to be connected to input and output electrodes and/or a ground electrode of the electronic component is divided into an inner portion having the pad and an outer portion having the sealing electrode with a stepped side wall as a border for preventing the sealing member from flowing, and one of the inner portion and the outer portion projects relative to the other.

3 Claims, 15 Drawing Sheets

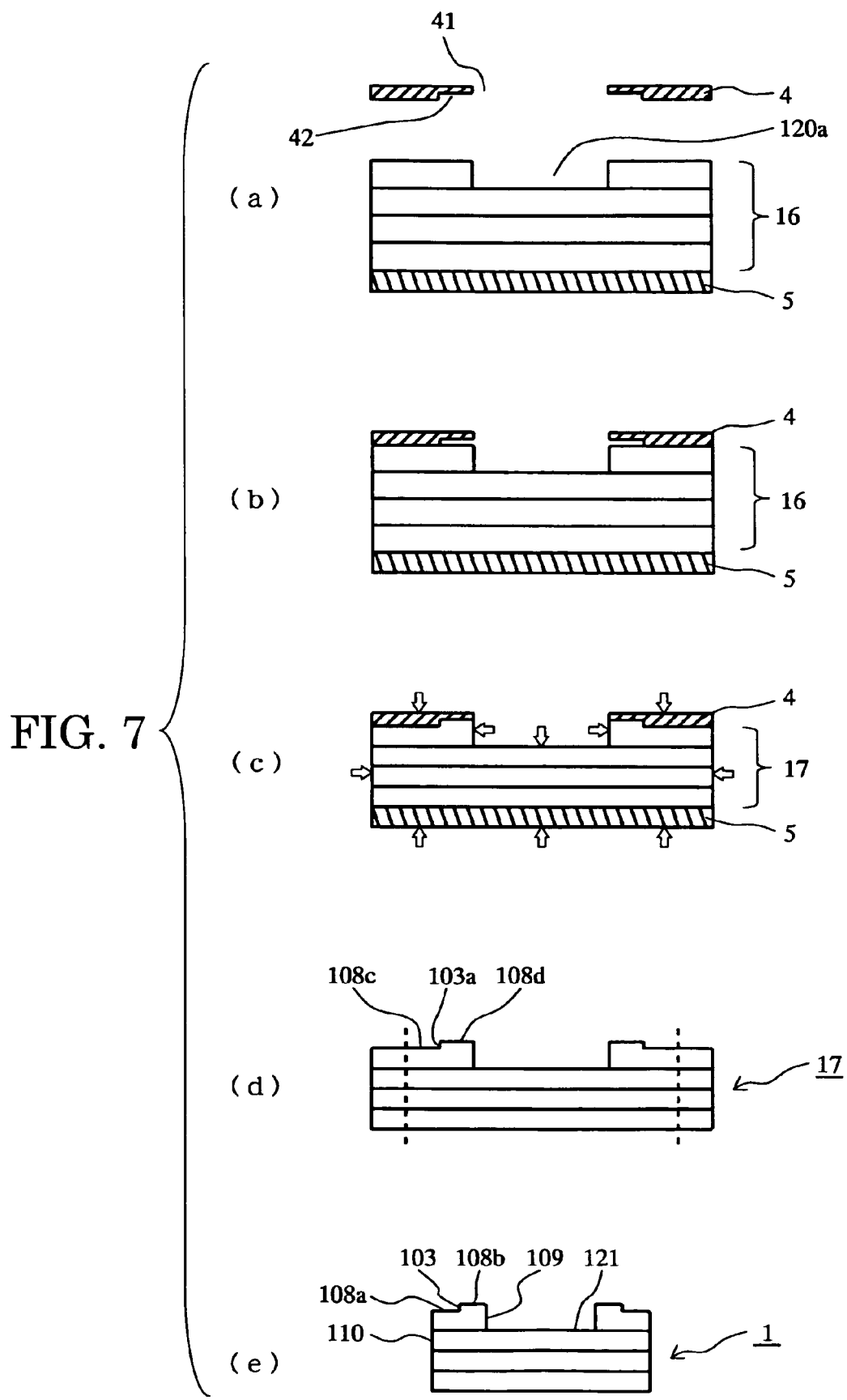

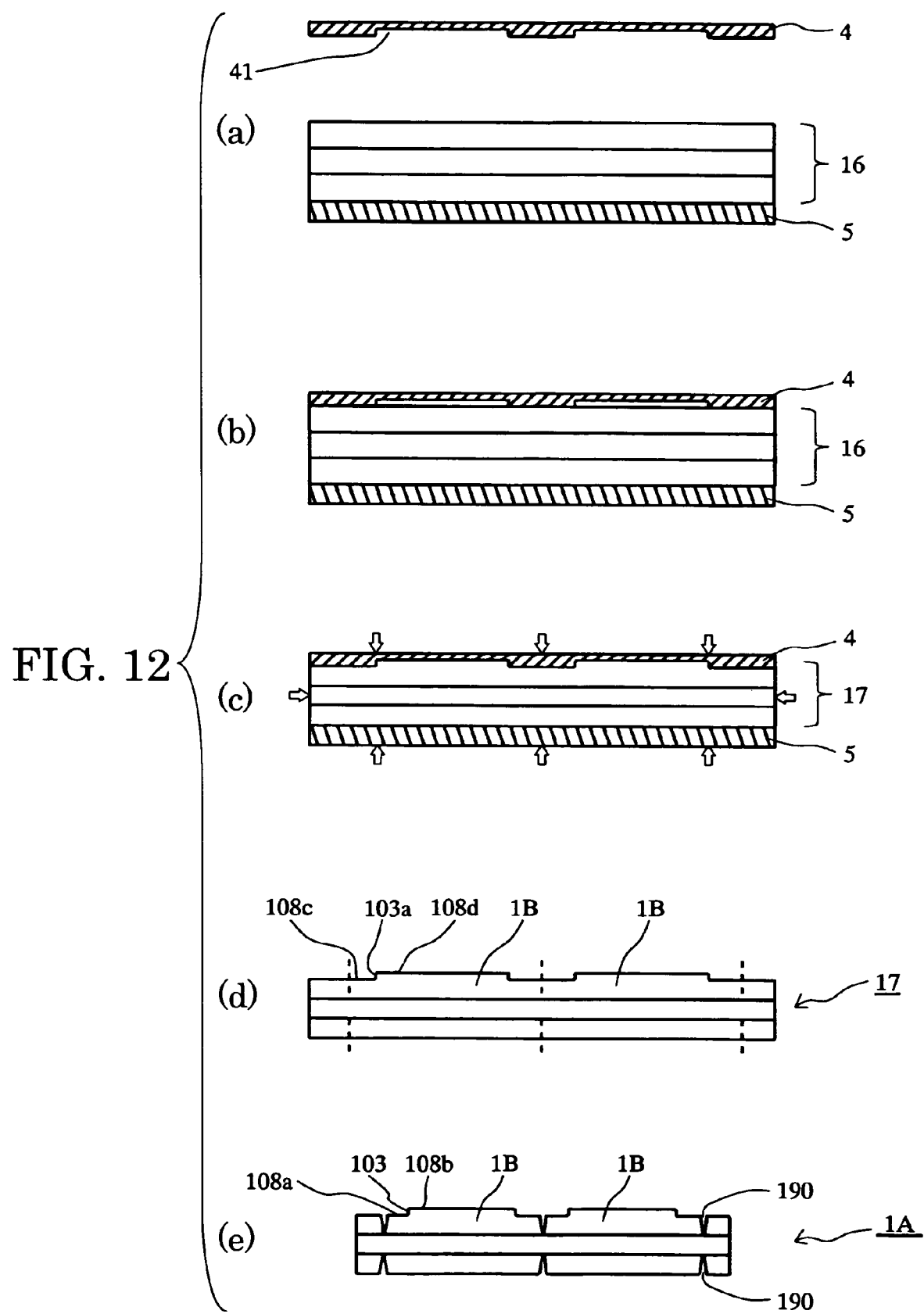

CERAMIC PACKAGE, ASSEMBLED SUBSTRATE, AND MANUFACTURING METHOD THEREFOR

The priority application Number 2004-234590 upon which this patent application is based is hereby incorporated by reference.

BACKGROUND OF THE INVENTION

1. Field of the Invention

The present invention relates to a ceramic package used in an electronic device such as an antenna duplexer, for example, having a ceramic package including one or more ceramic layers, an electronic component such as a surface acoustic wave filter device mounted thereon, and a lid sealing the package, and to a ceramic package assembled substrate having ceramic package parts to be the ceramic package connected two-dimensionally.

2. Description of Related Art

CONVENTIONAL EXAMPLE 1

An antenna duplexer of conventional example 1 shown in FIG. 14 includes a ceramic package 1 having a plurality of ceramic layers 11, 12, 13, 14 laminated therein, a surface acoustic wave filter device 8, a bonding wire 9, and a lid 2.

The ceramic package 1 has a cavity 120 formed with an inner wall 109 of a first ceramic layer 11 and an upper surface 121 of a second ceramic layer 12. The surface acoustic wave filter device 8 is bonded and fixed with a conductive bond 7 to a ground electrode 115 provided on the upper surface 121 of the second ceramic layer 12. A plurality of input and output electrodes (not shown) and a plurality of ground electrodes (not shown) of the surface acoustic wave filter device 8 are connected through the bonding wire 9 to a wire bonding pad 101 provided on an upper surface 108 of the first ceramic layer 11.

Ceramic layers 13, 14 have formed on a surface thereof internal electrodes 111 such as an inductor or a capacitor, which are connected to the wire bonding pad 101 through a via hole 112 filled with a conductive material. Some of the internal electrodes 111 extend to a peripheral edge of the ceramic layers to connect to a side electrode 114 formed on a side surface 110 of the ceramic package 1, and are further connected to a bottom electrode 113 provided on a bottom surface of the ceramic package 1. The bottom electrode 113 is for mounting the antenna duplexer on a mother board with a solder paste or the like.

A sealing member 3 of silver-tin or the like is preliminarily provided on an opening surface 21 of the lid 2. The ceramic package 1 is placed in a reflow furnace, and heated and cooled in nitrogen atmosphere with the sealing member 3 provided on the opening surface 21 of the lid 2 in contact at a given load with a sealing electrode 102 provided on the first ceramic layer 11. The opening surface 21 and the sealing electrode 102 are thereby fusion-fixed with the sealing member 3 to complete sealing. The sealing electrode 102 is connected to an internal electrode, a side electrode, and a bottom electrode, for ground. The electrodes in the ceramic package 1, the wire bonding pad 101, and the via hole 112 are formed of a conductive material such as silver or silver-palladium, for example.

CONVENTIONAL EXAMPLE 2

An antenna duplexer of conventional example 2 shown in FIG. 15 includes a ceramic package 1 having a plurality of ceramic layers 11, 12, 13 laminated therein, a surface acoustic wave filter device 8, and a metal lid 2. The same reference numeral as in conventional example 1 is given to the same part or portion as in conventional example 1.

Main differences from conventional example 1 are that the surface acoustic wave filter device 8 and the ceramic package 1 are electrically connected by flip-chip mounting in place of wire bonding, and that the ceramic package 1 has no cavity.

The surface acoustic wave filter device 8 has a bottom surface thereof provided with a plurality of input and output electrodes (not shown) and a plurality of ground electrodes (not shown) preliminarily having a metal bump 81 thereon, which is flip-chip mounted on a flip-chip mounting pad 116 provided on an upper surface 108 of a first ceramic layer 11.

Ceramic layers 12, 13 have formed on a surface thereof internal electrodes 111 such as an inductor or a capacitor, which are connected to the flip-chip mounting pad 116 through a via hole 112 filled with a conductive material. Some of the internal electrodes 111 extend to a peripheral edge of the ceramic layers to connect to a side electrode 114 formed on a side surface 110 of the ceramic package 1, and are further connected to a bottom electrode 113 provided on a bottom surface of the ceramic package 1. The bottom electrode 113 is for mounting the antenna duplexer on a mother board with a solder paste or the like.

A sealing member 3 of silver-tin or the like is preliminarily provided on an opening surface 21 of the lid 2. The ceramic package 1 is placed in a reflow furnace, and heated and cooled in nitrogen atmosphere with the sealing member 3 provided on the opening surface 21 of the lid 2 in press-contact at a given load with a sealing electrode 102 provided on the first ceramic layer 11. The opening surface 21 and the sealing electrode 102 are thereby fusion-fixed with the sealing member 3 to complete sealing. The sealing electrode 102 is connected to an internal electrode, a side electrode, and a bottom electrode, for ground. The electrodes in the ceramic package 1, the flip-chip mounting pad 116, and the via hole 112 are formed of a conductive material such as silver or silver-palladium, for example (see JP 10-335964 A).

There has been an increasing demand from a market for a smaller and lighter mobile communication terminal such as a portable telephone, and also for a smaller and lighter electronic device such as an antenna duplexer used in the mobile communication terminal.

In conventional example 1, in order for the antenna duplexer to be smaller and lighter, the ceramic package 1 has been made to have a thinner thickness between the inner wall 109 and the side surface 110 of the first ceramic layer 11 so as to be smaller in width and depth, making the wire bonding pad 101 closer to the sealing electrode 102. FIG. 16(a) shows a principal part of a sealing portion before sealing of the lid in which the lid is press-contacted with the ceramic package, and FIG. 16(b) shows a principal part of the sealing portion after the sealing of the lid. As seen in FIG. 16(a), the wire bonding pad 101 and the sealing electrode 102 provided on the upper surface 108 of the first ceramic layer 11 are close. This is highly likely to cause a short circuit failure because, as shown in FIG. 16(b), the sealing member 3 flowing out during the sealing can reach the wire bonding pad 101 for the input and output electrodes.

Similarly, in conventional example 2, in order for the antenna duplexer to be smaller and lighter, the ceramic package 1 has been made to have a narrower distance between the side surface 110 of the ceramic package 1 and a side surface of the surface acoustic wave filter device 8 so as to be smaller in width and depth, making the flip-chip mounting pad 116 closer to the sealing electrode 102. FIG. 17(*a*) shows a principal part of a sealing portion before sealing of the lid in which the lid is press-contacted with the ceramic package, and FIG. 17(*b*) shows a principal part of the sealing portion after the sealing of the lid. As seen in FIG. 17(*a*), the flip-chip mounting pad 116 and the sealing electrode 102 provided on the upper surface of the first ceramic layer 11 are close. This is highly likely to cause a short circuit failure because, as shown in FIG. 17(*b*), the sealing member 3 flowing out during the sealing can reach the flip-chip mounting pad 116 for the input and output electrodes.

SUMMARY OF THE INVENTION

An object of the present invention is to provide a ceramic package and a manufacturing method therefor, in which even if the package is made smaller and lighter, an occurrence rate of a short circuit failure can be greatly lowered between a pad for input and output electrodes of the ceramic package and a lid of a ground potential. Another object of the present invention is to provide a ceramic package assembled substrate and a manufacturing method therefor, in which even if a ceramic package is made smaller and lighter, an occurrence rate of a short circuit failure can be greatly lowered between a pad for input and output electrodes of a ceramic package part and a lid of a ground potential.

The first invention of the present invention is a ceramic package comprising one or more ceramic layers and being capable of having an electronic component and a lid fixed to a surface thereof, wherein a surface of a ceramic layer having a pad to be connected to input and output electrodes and/or a ground electrode of the electronic component is divided into an inner portion having the pad and an outer portion with a stepped side wall as a border for preventing a sealing member from flowing, and one of the inner portion and the outer portion projects relative to the other.

The outer portion may have a sealing electrode for joining the lid through the sealing member. Furthermore, the pad may be a wire bonding pad to be connected through a bonding wire to the input and output electrodes and/or the ground electrode of the electronic component, or a flip-chip mounting pad to be flip-chip mounted to the input and output electrodes and/or the ground electrode of the electronic component.

The second invention of the present invention is a ceramic package assembled substrate comprising ceramic package parts to be the ceramic package of the first invention connected two-dimensionally.

The third invention of the present invention is a manufacturing method for a ceramic package in which a ceramic layer has a surface provided with an inner portion and an outer portion with a stepped side wall as a border, and one of the inner portion and the outer portion projects relative to the other, the manufacturing method for the ceramic package comprising the steps of:

preparing a step-forming mask having a recess corresponding to either the inner portion or the outer portion to be projected, the recess having a generally flat bottom surface;

positioning and fixing the step-forming mask on a non-pressed body having one or more green sheets positioned; and vacuum-packing the body to obtain a vacuum-packed body, and thereafter applying hydrostatic pressure to integrate the vacuum-packed body.

The fourth invention of the present invention is a manufacturing method for a ceramic package assembled substrate having connected two-dimensionally ceramic package parts to be a ceramic package in which a ceramic layer has a surface provided with an inner portion and an outer portion with a stepped side wall as a border, and one of the inner portion and the outer portion projects relative to the other, the manufacturing method for the ceramic package assembled substrate comprising the steps of:

preparing a step-forming mask having a recess corresponding to either the inner portion or the outer portion to be projected, the recess having a generally flat bottom surface;

positioning and fixing the step-forming mask on a non-pressed body having one or more green sheets positioned; and vacuum-packing the body to obtain a vacuum-packed body, and thereafter applying hydrostatic pressure to integrate the vacuum-packed body.

According to the first invention of the present invention, a following effect can be obtained. In the case where the ceramic package is fixed to a jig with the sealing electrode provided on the ceramic layer of the ceramic package facing up, and the lid is placed such that the sealing member of the opening surface of the lid faces to the sealing electrode, and press-contacted with the sealing electrode at a given load, when the ceramic package is placed in a reflow furnace and heated in nitrogen atmosphere with the lid press-contacted with the sealing electrode, the sealing member melting flows out toward the pad from between the sealing electrode of the ceramic package and the opening surface of the lid due to the load applied to the lid. However, the stepped side wall can prevent the sealing member from flowing because the pad projects relative to the sealing electrode. The sealing member solidifies after cooled without reaching the pad.

In contrast, in the case where the lid is fixed to a jig with the sealing member provided on the opening surface of the lid facing up, and the ceramic package is placed such that the sealing electrode provided on the ceramic layer of the ceramic package faces to the sealing member, and press-contacted with the sealing member at a given load, when the lid is placed in a reflow furnace and heated in nitrogen atmosphere with the ceramic package press-contacted to the sealing member, the sealing member melting flows out toward the pad from between the sealing electrode of the ceramic package and the opening surface of the lid due to the load applied to the ceramic package. However, the stepped side wall can prevent the sealing member from flowing because the pad is positioned higher than the sealing electrode. The sealing member solidifies after cooled without reaching the pad.

Accordingly, in either case, an occurrence rate of a short circuit failure can be greatly lowered between the pad for the input and output electrodes of the ceramic package and the lid of a ground potential.

The first invention may be carried out into a ceramic package including a wire bonding pad to be connected through a bonding wire to the input and output electrodes and/or the ground electrode of the electronic component, or a flip-chip mounting pad to be flip-chip mounted to the input and output electrodes and/or the ground electrode of the electronic component.

According to the second invention of the present invention, a following effect can be obtained. The ceramic package assembled substrate has connected two-dimensionally ceramic package parts to be the ceramic package of the first invention. Therefore, the above-described effect of the first invention can be enjoyed.

In a later process when the ceramic package assembled substrate is divided along a break groove, a plurality of ceramic packages can be obtained. When the ceramic package assembled substrate before divided has the electronic component and the lid mounted thereon and thereafter is divided, a mounting process can be more efficient than that where the electronic component and the lid are mounted on the separate ceramic packages. Therefore, in view of only an efficiency of the mounting process for a user, the ceramic package assembled substrate of the second invention is probably more advantageous than the ceramic package of the first invention.

According to the third and fourth inventions of the present invention, a desired shape can be easily provided on a surface of the ceramic package and the ceramic package parts by a simple method of positioning and fixing a step-forming mask having a recess corresponding to either the inner portion or the outer portion to be projected, the recess having a generally flat bottom surface, on a non-pressed body having one or more green sheets positioned, and applying hydrostatic pressure.

If a ceramic package with a shape of the first invention attempted to be prepared by prior art, only grinding machine work could be relied on. However, ceramic is hard and takes time to be ground, which increases man-hours. Furthermore, an occurrence of chips and cracks causes a lower yield and reliability. If a ceramic package assembled substrate with a shape of the second invention attempted to be prepared by prior art, only grinding machine work could be relied on. However, in addition to the above-described problems of the increased man-hours, chips and cracks, the ceramic package assembled substrate can break along the break groove, which causes a still lower yield and reliability. The methods of the third and fourth inventions need no grinding, so that effects can be obtained such as decreased man-hours compared with grinding work and improvements of defects of chips, cracks, and breaks.

BRIEF DESCRIPTION OF THE DRAWINGS

FIG. 7 illustrates the steps in an example of a manufacturing method for a ceramic package of the present invention;

FIG. 12 illustrates the steps in an example of a manufacturing method for a ceramic package assembled substrate of the present invention;

DETAILED DESCRIPTION OF THE INVENTION

The above-described objects, features, and advantages of the present invention will be more apparent from a detailed description of examples which will be given below with reference to the drawings.

EXAMPLE 1

Figure 1:
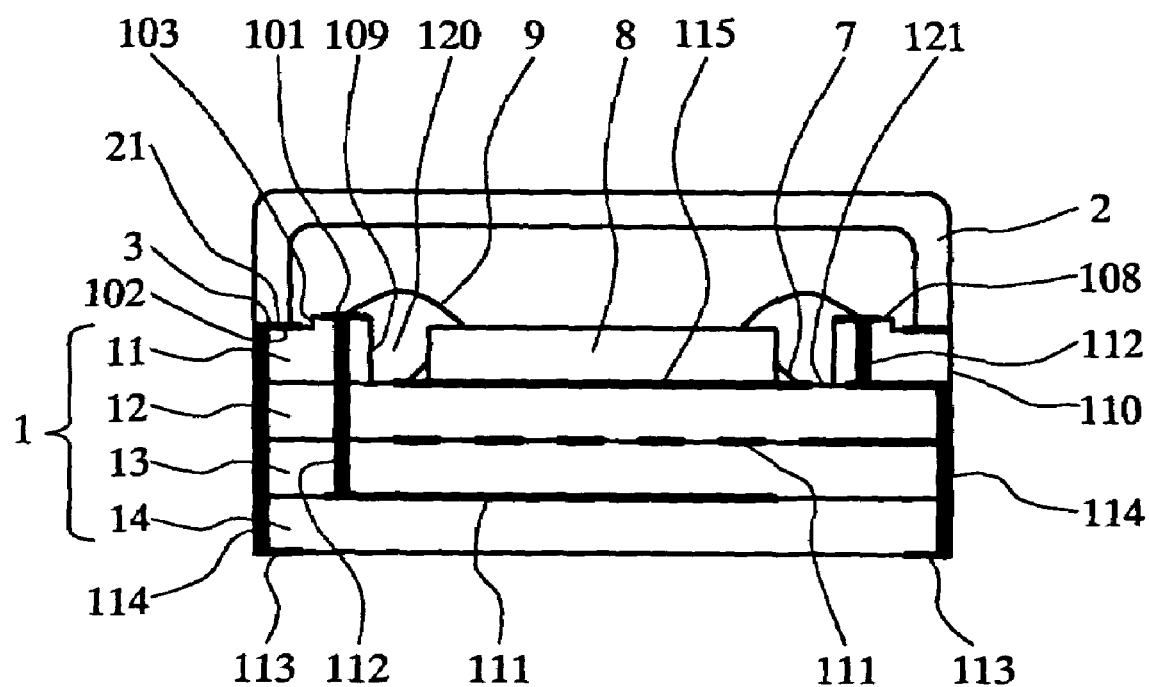
FIG. 1 is a sectional view of an antenna duplexer including a ceramic package of the present invention.

FIG. 1 is a sectional view of an antenna duplexer including a ceramic package of example 1 of the first invention. The antenna duplexer includes a ceramic package 1 having four ceramic layers 11, 12, 13, 14 laminated therein, a surface acoustic wave filter device 8, a bonding wire 9, and a metal lid 2.

The ceramic package 1 has a cavity 120 formed with an inner wall 109 of a first ceramic layer 11 and an upper surface 121 of a second ceramic layer 12. The surface acoustic wave filter device 8 is bonded and fixed with a conductive bond 7 to a ground electrode 115 provided on the upper surface 121 of the second ceramic layer 12. A plurality of input and output electrodes (not shown) and a plurality of ground electrodes (not shown) of the surface acoustic wave filter device 8 are connected through the bonding wire 9 to a plurality of wire bonding pads 101 provided on an upper surface 108 of the first ceramic layer 11.

Ceramic layers 13, 14 have formed on a surface thereof internal electrodes 111 such as an inductor or a capacitor, which are connected to the wire bonding pads 101 through a via hole 112 filled with a conductive material. Some of the internal electrodes 111 extend to a peripheral edge of the ceramic layers to connect to a side electrode 114 formed on a side surface 110 of the ceramic package 1, and are further connected to a bottom electrode 113 provided on a bottom surface of the ceramic package 1. The bottom electrode 113 is for mounting the antenna duplexer on a mother board with a solder paste or the like. A sealing electrode 102 is connected to an internal electrode, a side electrode, and a bottom electrode, for ground. Silver was used as a conductive material for the electrodes in the ceramic package 1, the wire bonding pads 101, and the via hole 112.

Figure 2:
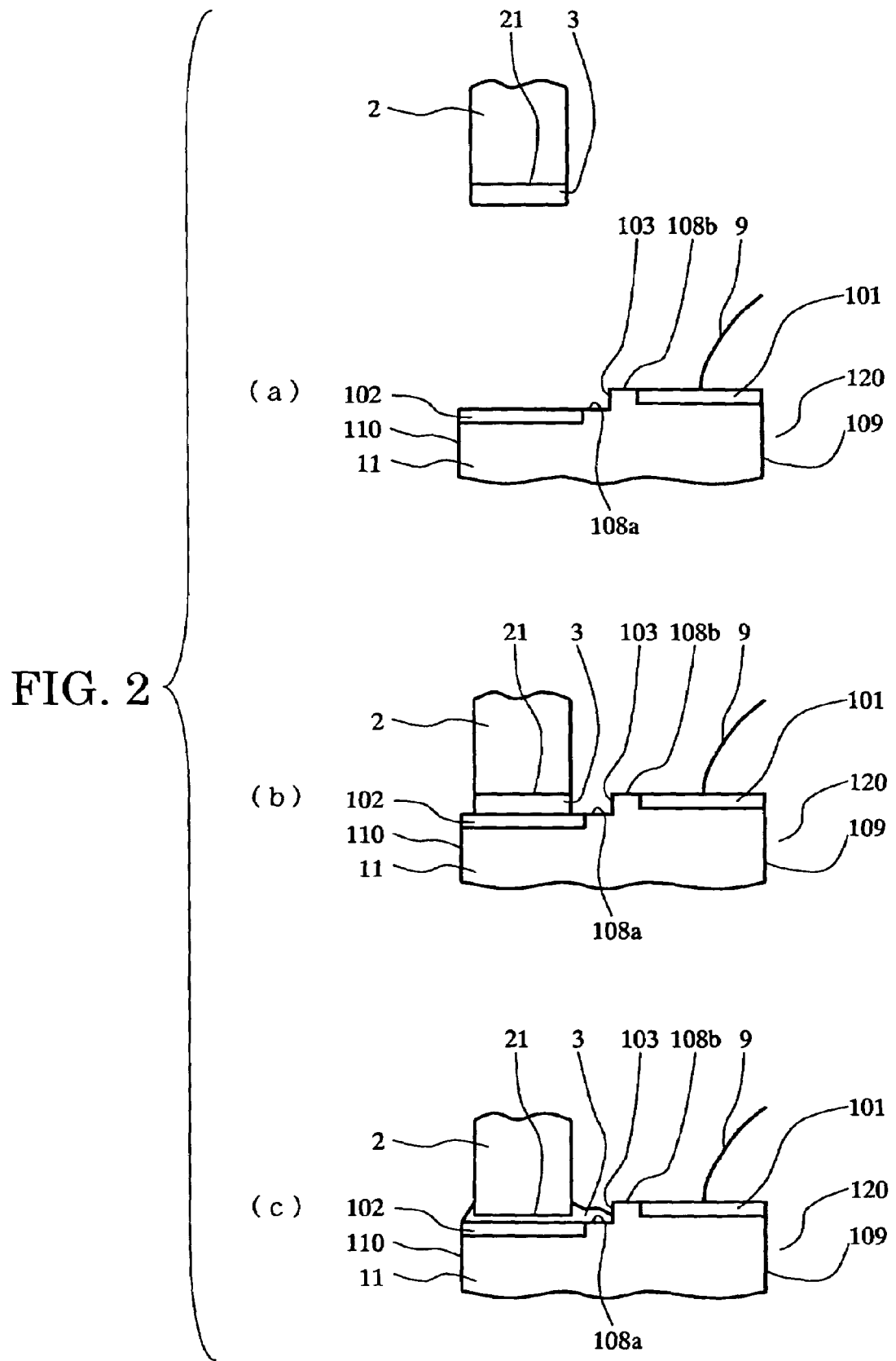
FIG. 2 includes enlarged views of a cutout portion illustrating sealing of a lid to a ceramic package of a first example of the present invention.

FIGS. 2(a)-(c) show enlarged views of a cutout portion near the upper surface 108 of the first ceramic layer 11 and an opening surface 21 of the lid 2 in order to illustrate a movement of a sealing member 3.

First prepared are the ceramic package 1 in which the surface acoustic wave filter device 8 is bonded and fixed, and thereafter wire-bonded, and the lid 2. As shown in FIG. 2(a), the upper surface 108 of the first ceramic layer 11 has a step, and divided into an outer portion 108a and an inner portion 108b with a stepped side wall 103 as a border. The outer portion 108a and the inner portion 108b each have a generally flat surface with a width of 0.3 mm. The inner portion 108b projects by 0.06 mm relative to the outer portion 108a. The outer portion 108a has the sealing electrode 102 while the inner portion 108b has a wire bonding pad 101. The sealing electrode 102 and the wire bonding pad 101 have each surface formed with a gold plating film and a nickel plating film. The sealing member 3 made of silver-tin is preliminarily provided on the opening surface 21 of the lid 2.

Next, as shown in FIG. 2(b), the ceramic package 1 is fixed to a jig or the like (not shown) with the sealing electrode 102 provided on the first ceramic layer 11 of the ceramic package 1 facing up, and the lid 2 is placed such that the sealing member 3 of the opening surface 21 of the lid 2 faces to the sealing electrode 102, and press-contacted with the sealing electrode 102 at a given load.

When the ceramic package 1 is placed in a reflow furnace, and heated and cooled in nitrogen atmosphere with the lid 2 press-contacted with the sealing electrode 102, the opening surface 21 and the sealing electrode 102 are fusion-fixed with the sealing member 3 to complete sealing. FIG. 2(c) shows a state after the sealing. The sealing member 3 melts by being heated in the reflow furnace. However, even if the sealing member 3 flows out toward the wire bonding pad 101 from between the sealing electrode 102 of the ceramic package 1 and the opening surface 21 of the lid 2 due to the load applied to the lid 2, the stepped side wall 103 can prevent the sealing member 3 from flowing because the wire bonding pad 101 projects relative to the sealing electrode 102. The sealing member 3 solidifies after cooled without reaching the wire bonding pad 101. Accordingly, an occurrence rate of a short circuit failure can be greatly lowered between the wire bonding pad for the input and output electrodes of the ceramic package and the lid of a ground potential.

A projecting amount was 0.06 mm in the present example, but the projecting amount may be set with consideration of a volume of the sealing member 3 and a width of the outer portion 108a such that the stepped side wall can prevent the melting sealing member from overflowing.

EXAMPLE 2

Figure 3:
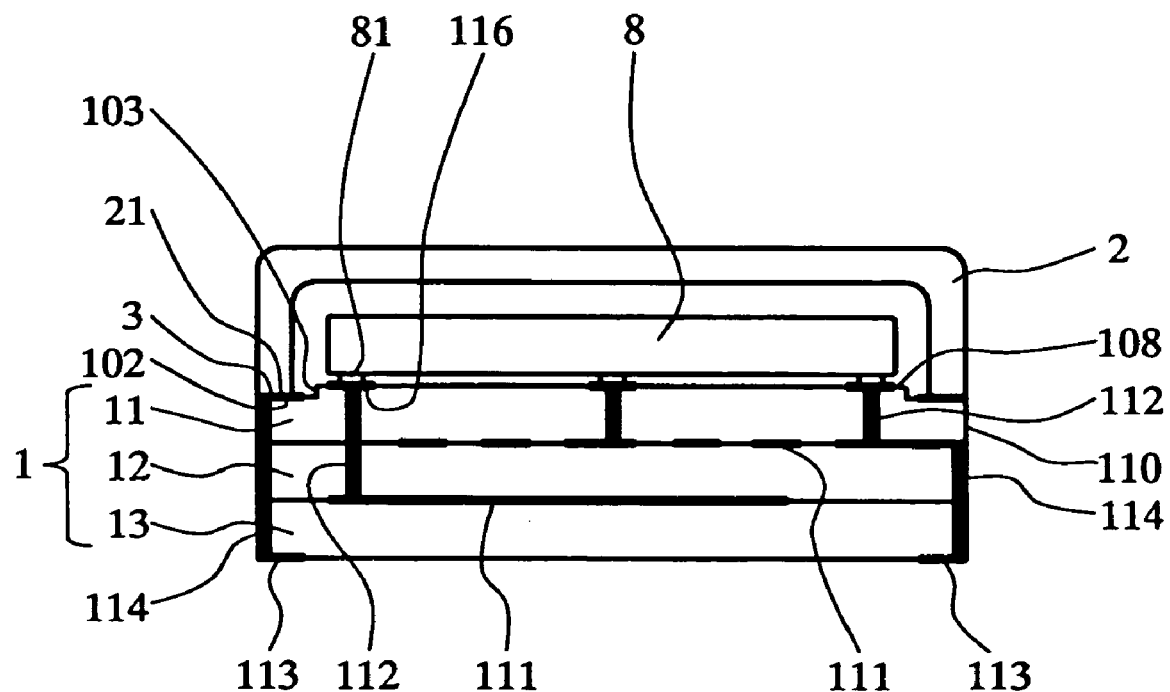
FIG. 3 is a sectional view of another antenna duplexer including a ceramic package of the present invention.

FIG. 3 is a sectional view of an antenna duplexer including a ceramic package of example 2 of the first invention. The antenna duplexer includes a ceramic package 1 having three ceramic layers 11, 12, 13 laminated therein, a surface acoustic wave filter device 8, and a metal lid 2. The same reference numeral as in example 1 is given to the same part or portion as in example 1.

Main differences from example 1 are that the surface acoustic wave filter device 8 and the ceramic package 1 are electrically connected by flip-chip mounting in place of wire bonding, and that the ceramic package 1 has no cavity. The surface acoustic wave filter device 8 has a bottom surface thereof provided with a plurality of input and output electrodes (not shown) and a plurality of ground electrodes (not shown) preliminarily having a metal bump 81 thereon, which is flip-chip mounted on a flip-chip mounting pad 116 on a first ceramic layer 11.

Ceramic layers 12, 13 have formed on a surface thereof internal electrodes 111 such as an inductor or a capacitor, which are connected to the flip-chip mounting pad 116 through a via hole 112 filled with a conductive material. Some of the internal electrodes 111 extend to a peripheral edge of the ceramic layers to connect to a side electrode 114 formed on a side surface 110 of the ceramic package 1, and are further connected to a bottom electrode 113 provided on a bottom surface of the ceramic package 1. The bottom electrode 113 is for mounting the antenna duplexer on a mother board with a solder paste or the like. A sealing electrode 102 is connected to an internal electrode, a side electrode, and a bottom electrode, for ground. Silver was used as a conductive material for the electrodes in the ceramic package 1, the flip-chip mounting pad 116, and the via hole 112.

Figure 4:
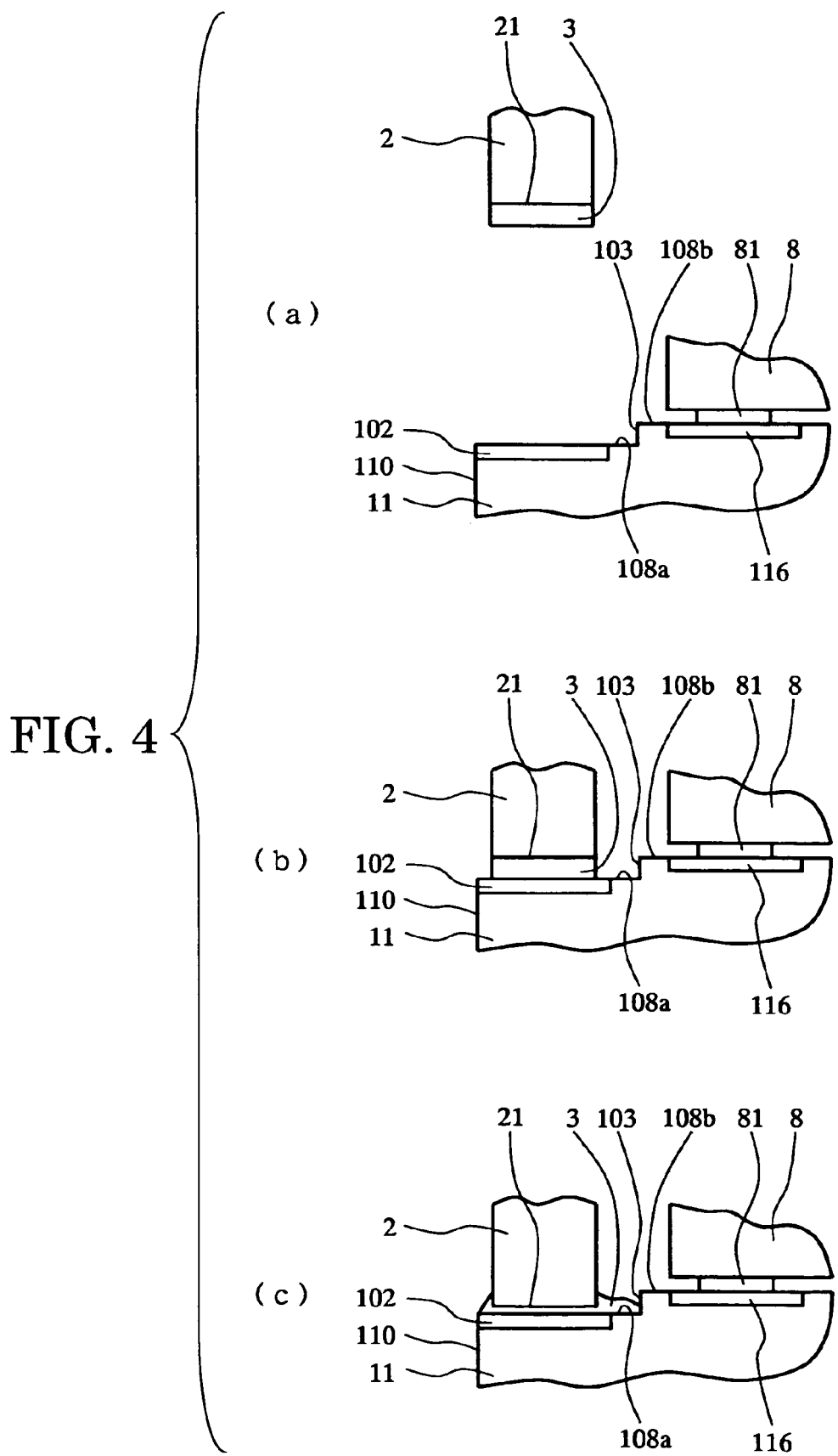
FIG. 4 includes enlarged views of a cutout portion illustrating sealing of a lid to a ceramic package of a second example of the present invention.

FIGS. 4(a)-(c) show enlarged views of a cutout portion near an upper surface 108 of the first ceramic layer 11 and an opening surface 21 of the lid 2 in order to illustrate a movement of a sealing member 3.

First prepared are the ceramic package 1 having the surface acoustic wave filter device 8 flip-chip mounted thereon and the lid 2. As shown in FIG. 4(a), the upper surface 108 of the first ceramic layer 11 has a step, and divided into an outer portion 108a and an inner portion 108b with a stepped side wall 103 as a border. The outer portion 108a and the inner portion 108b each have a generally flat surface, and the outer portion 108a has a width of 0.3 mm. A distance between the stepped side wall 103 and the flip-chip mounting pad 116 is 0.3 mm. The inner portion 108b projects by 0.06 mm relative to the outer portion 108a. The outer portion 108a has the sealing electrode 102 while the inner portion 108b has the flip-chip mounting pad 116. The sealing electrode 102 and the flip-chip mounting pad 116 have each surface formed with a gold plating film and a nickel plating film. The sealing member 3 made of silver-tin is preliminarily provided on the opening surface 21 of the lid 2.

Next, as shown in FIG. 4(b), the ceramic package 1 is fixed to a jig or the like (not shown) with the sealing electrode 102 provided on the first ceramic layer 11 of the ceramic package 1 facing up, and the lid 2 is placed such that the sealing member 3 of the opening surface 21 of the lid 2 faces to the sealing electrode 102, and press-contacted with the sealing electrode 102 at a given load.

When the ceramic package 1 is placed in a reflow furnace, and heated and cooled in nitrogen atmosphere with the lid 2 press-contacted with the sealing electrode 102, the opening surface 21 and the sealing electrode 102 are fusion-fixed with the sealing member 3 to complete sealing. FIG. 4(c) shows a state after the sealing. The sealing member 3 melts by being heated in the reflow furnace. However, even if the sealing member 3 flows out toward the flip-chip mounting pad 116 from between the sealing electrode 102 of the ceramic package 1 and the opening surface 21 of the lid 2 due to the load applied to the lid 2, the stepped side wall 103 can prevent the sealing member 3 from flowing because the flip-chip mounting pad 116 projects relative to the sealing electrode 102. The sealing member 3 solidifies after cooled without reaching the flip-chip mounting pad 116. Accordingly, an occurrence rate of a short circuit failure can be greatly lowered between the flip-chip mounting pad for the input and output electrodes of the ceramic package and the lid of a ground potential.

EXAMPLE 3

A description is given of a ceramic package of example 3 of the first invention. In the ceramic package 1 of example 1 or 2, the wire bonding pad 101 or the flip-chip mounting pad 116 projects relative to the sealing electrode 102. The ceramic package 1 of example 3, in contrast, has a flip-chip mounting pad 116 recessed relative to a sealing electrode 102, and, except for this, is same as in example 2.

Figure 5:
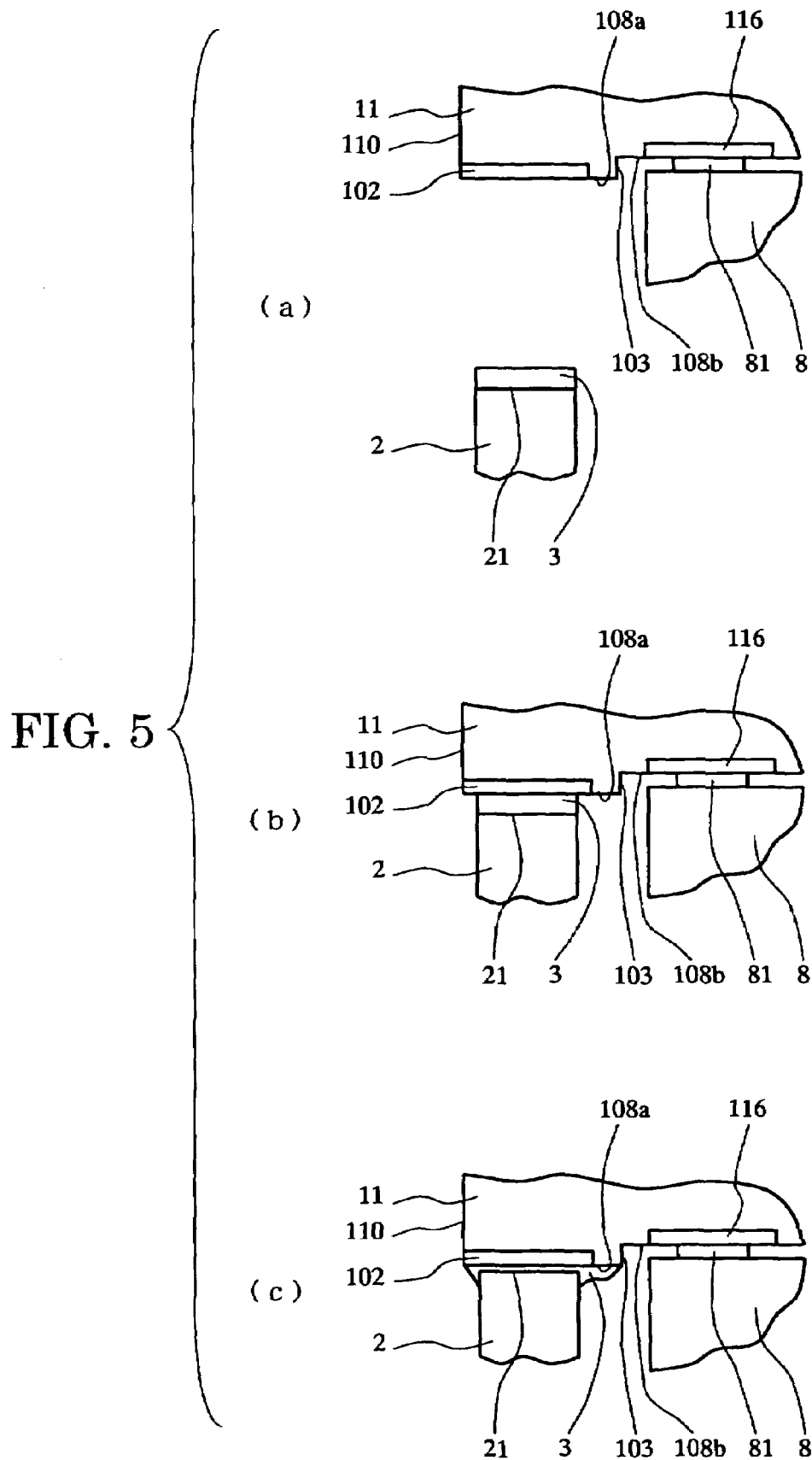
FIG. 5 includes enlarged views of a cutout portion illustrating sealing of a lid to a ceramic package of a third example of the present invention.

FIGS. 5(a)-(c) show enlarged views of a cutout portion near an upper surface 108 of a first ceramic layer 11 and an opening surface 21 of a lid 2 in order to illustrate a sealing process.

First prepared are the ceramic package 1 having a surface acoustic wave filter device 8 flip-chip mounted thereon and the lid 2. As shown in FIG. 5(a), the upper surface 108 of the first ceramic layer 11 has a step, and divided into an outer portion 108a and an inner portion 108b with a stepped side wall 103 as a border. The outer portion 108a and the inner portion 108b each have a generally flat surface, and the outer portion 108a has a width of 0.3 mm. A distance between the stepped side wall 103 and the flip-chip mounting pad 116 is 0.3 mm. The outer portion 108a projects by 0.06 mm relative to the inner portion 108b. The outer portion 108a has the sealing electrode 102 while the inner portion 108b has the flip-chip mounting pad 116. The sealing electrode 102 and the flip-chip mounting pad 116 have each surface formed with a gold plating film and a nickel plating film. A sealing member 3 made of silver-tin is preliminarily provided on the opening surface 21 of the lid 2.

Next, as shown in FIG. 5(b), the lid 2 is fixed to a jig or the like (not shown) with the sealing member 3 provided on the opening surface 21 of the lid 2 facing up, and the ceramic package 1 is placed such that the sealing electrode 102 provided on the first ceramic layer 11 of the ceramic package 1 faces to the sealing member 3, and press-contacted with the sealing member 3 at a given load.

When the lid 2 is placed in a reflow furnace, and heated and cooled in nitrogen atmosphere with the ceramic package 1 press-contacted with the sealing member 3, the sealing electrode 102 and the opening surface 21 are fusion-fixed with the sealing member 3 to complete sealing. FIG. 5(c) shows a state after the sealing. The sealing member 3 melts by being heated in the reflow furnace. However, even if the sealing member 3 flows out toward the flip-chip mounting pad 116 from between the sealing electrode 102 of the ceramic package 1 and the opening surface 21 of the lid 2 due to the load applied to the ceramic package 1, the stepped side wall 103 can prevent the sealing member 3 from flowing because the flip-chip mounting pad 116 is positioned higher than the sealing electrode 102. The sealing member 3 solidifies after cooled without reaching the flip-chip mounting pad 116. Accordingly, an occurrence rate of a short circuit failure can be greatly lowered between the flip-chip mounting pad for the input and output electrodes of the ceramic package and the lid of a ground potential.

The same effect can of course be brought also into a ceramic package 1 to be connected to a surface acoustic wave filter device 8 by wire bonding as in example 1 providing that the ceramic package 1 has an outer portion 108a (having a sealing electrode 102) on an upper surface 108 of a first ceramic layer 11 projecting relative to an inner portion 108b (having a wire bonding pad 101) like in the present example.

EXAMPLE 4

Figure 6A:
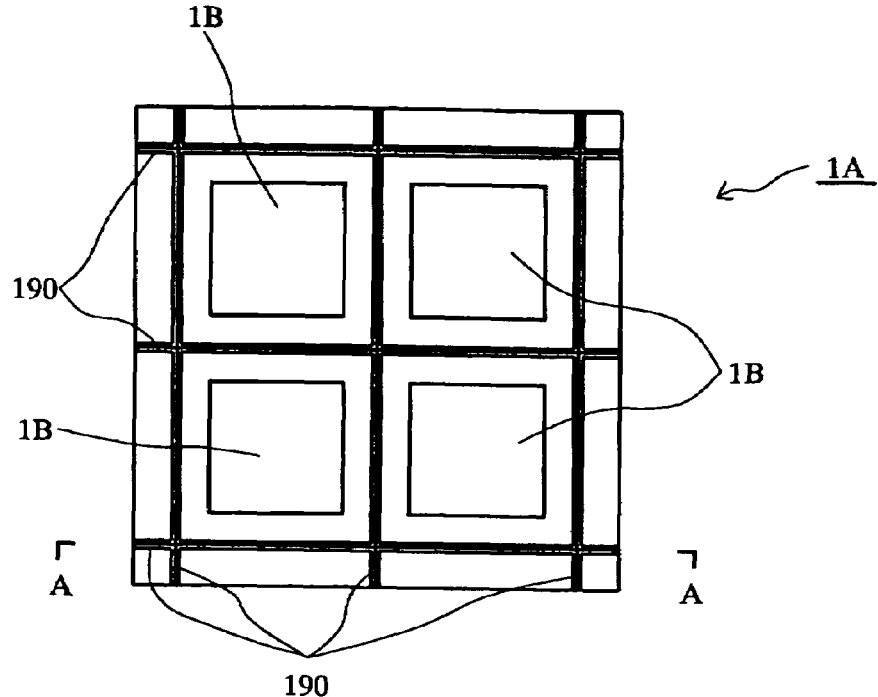
FIG. 6(a), FIG. 6(b), and FIG. 6(c) are a plan view and a sectional view of a ceramic package assembled substrate of the present invention, and a sectional view of a ceramic package formed by division, respectively.
Figure 6B:
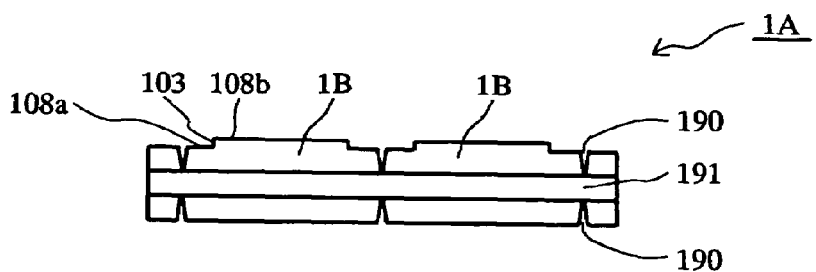

An example of the second invention will be described below. While examples 1 to 3 relate to a separate ceramic package, this example 4 relates to a ceramic package assembled substrate in which ceramic packages are not separate and ceramic package parts to be a ceramic package are connected two-dimensionally. FIG. 6(a) is a plan view of a ceramic package assembled substrate 1A having four ceramic package parts 1B connected to each other, and FIG. 6(b) is a sectional view showing the ceramic package assembled substrate 1A cut along a line A-A. For simple illustration, only a ceramic package base material is shown and electrodes etc. are not shown.

Figure 6C:
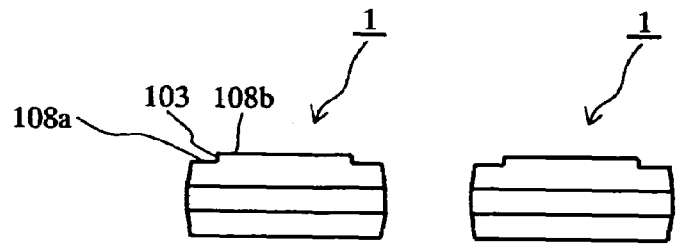

As seen in FIG. 6(c), dividing the ceramic package assembled substrate 1A along a break groove 190 makes four ceramic packages shown in example 2. The ceramic package assembled substrate 1A has the ceramic package parts 1B to be separate ceramic packages connected to each other at a connecting part 191. When the ceramic package assembled substrate 1A before divided has an electronic component and a lid mounted thereon and thereafter is divided, a mounting process can thereby be more efficient than that where the electronic component and the lid are mounted on the separate ceramic packages. A shape of an upper surface of a ceramic package part 1B is same as in example 2, and therefore not described in detail.

EXAMPLE 5

A description will be given below of an example of a manufacturing method for a ceramic package of the third invention. A green sheet is usually designed to provide tens to hundreds of ceramic packages per a sheet with a size of 50 mm×50 mm to 200 mm×200 mm. However, here, for simple description, a green sheet is designed to provide only one ceramic package per a sheet.

First prepared are a given number of green sheets having at a given location a through hole for a cavity 120a, a through hole for a via hole, a through hole for a side electrode, etc. and green sheets having at a given location a through hole for a via hole, a through hole for a side electrode, etc. Next, the green sheets with the holes have a silver paste of a conductive material applied thereto by screen printing method to form internal electrodes such as an inductor or a capacitor and other electrodes and fill a via hole with the silver paste. These printed green sheets are sequentially positioned and placed on a metal laminate jig 5 to prepare a non-pressed body 16. These steps are based on a known manufacturing method, and therefore not described in detail.

FIGS. 7(a)-(e) are pattern diagrams showing from a positioning and placing step described above through a pressing and integrating step of the third invention until completion. In FIG. 7(a), the non-pressed body 16 including four green sheets is positioned and fixed on the laminate jig 5 with a positioning pin. In FIGS. 7(a)-(e), only elements substantially relevant to the third invention are shown, and others (e.g., internal electrodes, the positioning pin, etc.) are not shown for simple illustration.

Figure 8A:
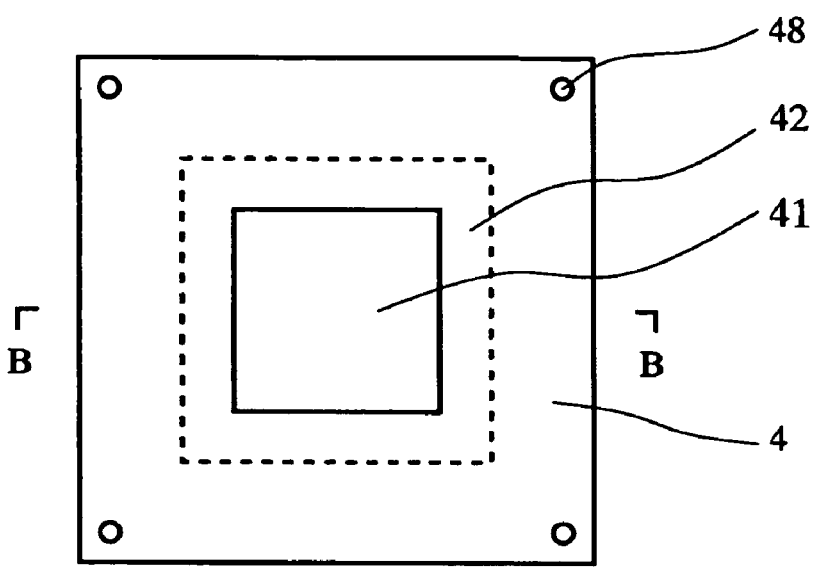
FIG. 8(a) and FIG. 8(b) are a plan view and a sectional view, respectively, of a step-forming mask of the present invention.
Figure 8B:
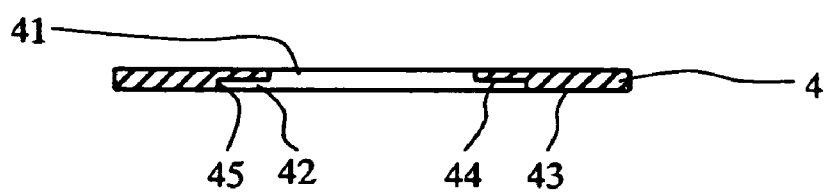

Next follows the pressing and integrating step of the third invention. Here, a step-forming mask 4 is prepared for ultimately forming a step on an upper surface of the ceramic package. FIG. 8(a) is a plan view of the step-forming mask 4, and FIG. 8(b) is a sectional view showing the step-forming mask 4 cut along a line B-B. The elastic step-forming mask 4 made from stainless steel has an opening 41 with the approximately same size as the through hole for a cavity 120a, a recess 42 with a generally flat bottom surface 44, and a positioning hole 48 through which the positioning pin of the laminate jig 5 passes. The recess 42 is for forming a portion to be an inner portion of the upper surface of the fired ceramic package, and an operation thereof will be described later in detail. The step-forming mask 4 has an overall thickness of 0.2 mm, and the recess 42 has a depth of 0.07 mm. The step-forming mask 4 can be easily prepared by etching or the like.

As shown in FIG. 7(b), the positioning pin of the laminate jig 5 is made to pass through the positioning hole 48 (not shown) of the step-forming mask 4, and thereby the step-forming mask 4 is positioned and fixed at a given location of the non-pressed body 16. Then, the non-pressed body 16, the step-forming mask 4, and the laminate jig 5 are sandwiched so as to be covered using an elastic member such as silicon rubber (for preventing a vacuum pack from exploding, not shown). Further, the non-pressed body 16 is placed in a vacuum-packing bag (not shown) and vacuum-packed to obtain a vacuum-packed body. The vacuum-packed body is dipped in given warm water, and the non-pressed body 16 is heated and softened by the warm water. Next, hydrostatic pressure is applied in the warm water at a given pressing pressure and time. The hydrostatic pressure is uniformly applied to the non-pressed body through the step-forming mask 4, the laminate jig 5, and the elastic member, as indicated by arrows shown in FIG. 7(c), and each of the green sheets is compressed and integrated to form a ceramic laminated body 17.

FIG. 7(d) shows the ceramic laminated body 17 obtained after cooled and the vacuum pack is opened. As seen in the drawing, the ceramic laminated body 17 after pressed and integrated has an upper surface in a shape corresponding to the step-forming mask 4 because the upper surface of the non-pressed body 16, which has been in contact with the step-forming mask 4, is pressured in a softened condition.

Specifically, surfaces 43, 44, 45 of the step-forming mask 4 shown in FIG. 8(b) form an outer portion 108c, an inner portion 108d, and a stepped side wall 103a, respectively, of the upper surface of the ceramic laminated body 17 shown in FIG. 7(d), and the inner portion 108d projects relative to the outer portion 108c.

Following steps are based on a known manufacturing method, and therefore not described in detail. This ceramic laminated body 17 is cut at a given cut location (dot line) with a cutter edge cutting machine or a dicer, fired, and plated to complete a ceramic package 1 shown in FIG. 7(e). As seen in FIG. 7(e), the ceramic package 1 has an upper surface formed with an outer portion 108a, an inner portion 108b, and a stepped side wall 103, corresponding to the outer portion 108c, the inner portion 108d, and the stepped side wall 103a, respectively, of FIG. 7(d).

EXAMPLE 6

A description will be given below of another example of a manufacturing method for a ceramic package of the third invention. A ceramic package 1 of example 6 includes three ceramic layers, and is a flat-plate type with no cavity. Except for this, the ceramic package 1 has the same construction as in example 5. The same reference numeral as in example 5 is given to the same part or portion as in example 5.

Steps of from providing holes in green sheets to positioning and placing the green sheets are same as in example 5 except for preparing a given number of green sheets only having at a given location a through hole for a via hole and a through hole for a side electrode, and therefore not described.

Figure 9:
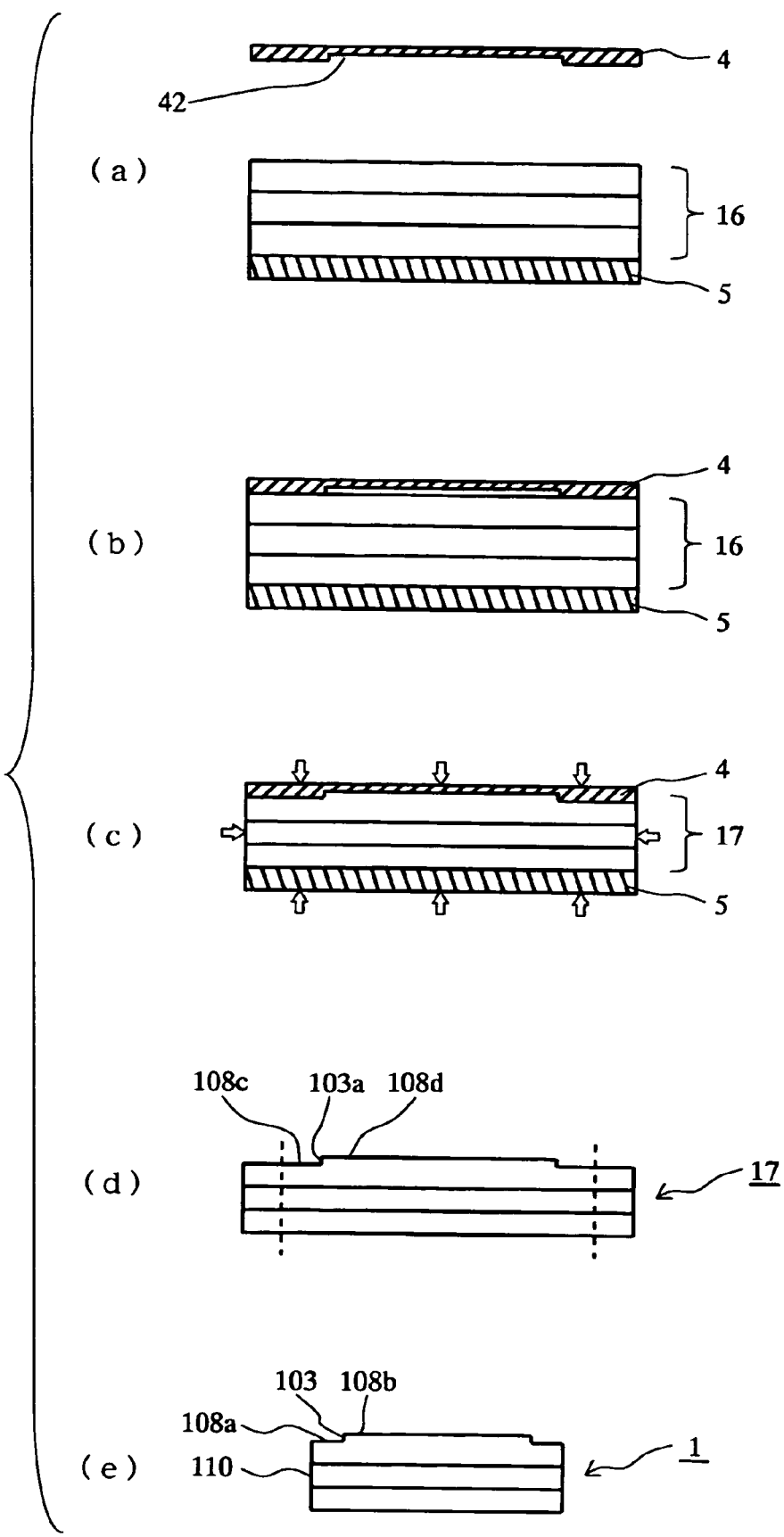
FIG. 9 illustrates the steps in another example of the manufacturing method for the ceramic package of the present invention.

FIGS. 9(a)-(e) are pattern diagrams showing from the positioning and placing step through a pressing and integrating step of the third invention until completion. In FIG. 9(a), a non-pressed body 16 including three green sheets is positioned and fixed on a laminate jig 5 with a positioning pin. In FIGS. 9(a)-(e), only elements substantially relevant to the third invention are shown, and others (e.g., internal electrodes, the positioning pin, etc.) are not shown for simple illustration.

Figure 10A:
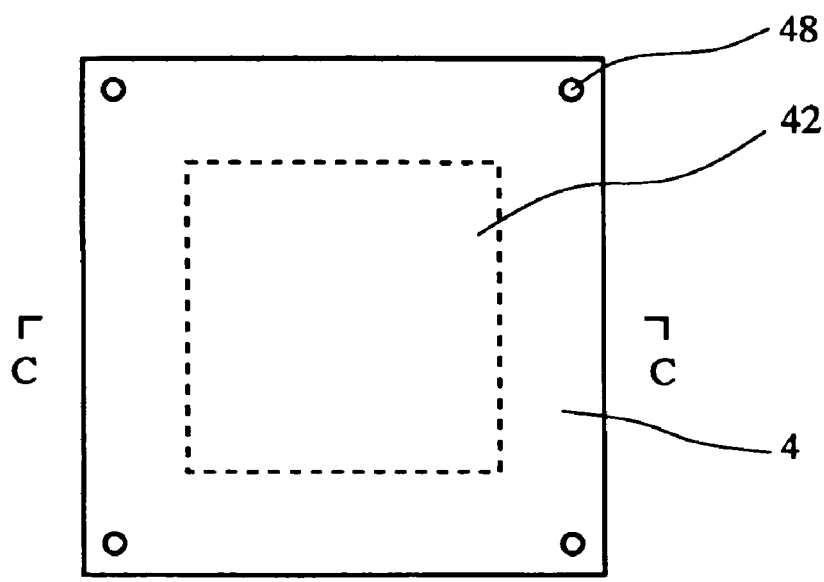
FIG. 10(a) and FIG. 10(b) are a plan view and a sectional view, respectively, of another step-forming mask of the present invention.
Figure 10B:
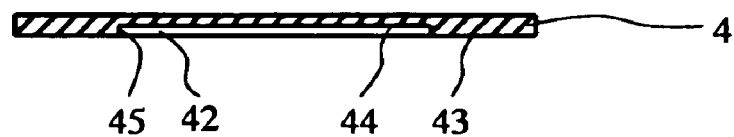

Next follows the pressing and integrating step of the third invention. Here, a step-forming mask 4 is prepared for ultimately forming a step on an upper surface of the ceramic package. FIG. 10(a) is a plan view of the step-forming mask 4, and FIG. 10(b) is a sectional view showing the step-forming mask 4 cut along a line C-C. The elastic step-forming mask 4 made from stainless has a recess 42 with a generally flat bottom surface 44 and a positioning hole 48 through which the positioning pin of the laminate jig 5 passes. The recess 42 is for forming a portion to be an inner portion of the upper surface of the fired ceramic package, and an operation thereof will be described later in detail. The step-forming mask 4 has an overall thickness of 0.2 mm, and the recess 42 has a depth of 0.07 mm.

As shown in FIG. 9(b), the positioning pin of the laminate jig 5 is made to pass through the positioning hole 48 (not shown) of the step-forming mask 4, and thereby the step-forming mask 4 is positioned and fixed at a given location of the non-pressed body 16. Then, the non-pressed body 16, the step-forming mask 4, and the laminate jig 5 are sandwiched so as to be covered using an elastic member such as silicon rubber (for preventing a vacuum pack from exploding, not shown). Further, the non-pressed body 16 is placed in a vacuum-packing bag (not shown) and vacuum-packed to obtain a vacuum-packed body. The vacuum-packed body is dipped in given warm water, and the non-pressed body 16 is heated and softened by the warm water. Next, hydrostatic pressure is applied in the warm water at a given pressing pressure and time. The hydrostatic pressure is uniformly applied to the non-pressed body through the step-forming mask 4, the laminate jig 5, and the elastic member, as indicated by arrows shown in FIG. 9(c), and each of the green sheets is compressed and integrated to form a ceramic laminated body 17.

FIG. 9(d) shows the ceramic laminated body 17 obtained after cooled and the vacuum pack is opened. As seen in the drawing, the ceramic laminated body 17 after pressed and integrated has an upper surface in a shape corresponding to the step-forming mask 4 because the upper surface of the non-pressed body 16, which has been in contact with the step-forming mask 4, is pressured in a softened condition.

Specifically, surfaces 43, 44, 45 of the step-forming mask 4 shown in FIG. 10(b) form an outer portion 108c, an inner portion 108d, and a stepped side wall 103a, respectively, of the upper surface of the ceramic laminated body 17 shown in FIG. 9(d), and the inner portion 108d projects relative to the outer portion 108c.

Following steps are based on a known manufacturing method, and therefore not described in detail. This ceramic laminated body 17 is cut at a given cut location (dot line) with a cutter edge cutting machine or a dicer, fired, and plated to complete a ceramic package 1 shown in FIG. 9(e). As seen in FIG. 9(e), the ceramic package 1 has an upper surface formed with an outer portion 108a, an inner portion 108b, and a stepped side wall 103, corresponding to the outer portion 108c, the inner portion 108d, and the stepped side wall 103a, respectively, of FIG. 9(d).

Figure 11A:
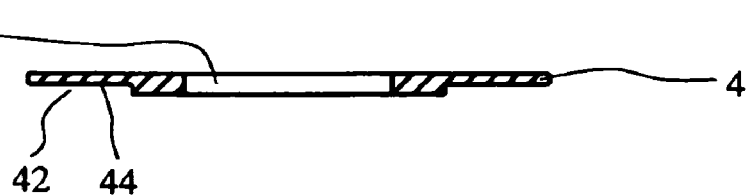
FIG. 11(a) and FIG. 11(b) are sectional views of still another step-forming mask of the present invention.
Figure 11B:
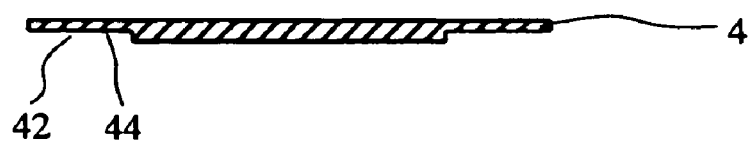

While examples 5 and 6 describe examples of a step-forming mask for a ceramic package having an inner portion projecting relative to an outer portion, use of a step-forming mask 4 with a sectional shape as shown in FIG. 11(a) and FIG. 11(b) allows a ceramic package having an outer portion projecting relative to an inner portion to be manufactured.

EXAMPLE 7

A description will be given below of a manufacturing method for a ceramic package assembled substrate of the fourth invention with an example of a ceramic package assembled substrate having four ceramic package parts connected two-dimensionally as described in example 4.

Steps of from providing holes in green sheets to positioning and placing the green sheets are same as in example 5 except for preparing a given number of green sheets only having at a given location a through hole for a via hole and a through hole for a side electrode for four ceramic packages, and therefore not described.

FIGS. 12(a)-(e) are pattern diagrams showing from the positioning and placing step through a pressing and integrating step of the fourth invention until completion. In FIG. 12(a), a non-pressed body 16 including three green sheets is positioned and fixed on a laminate jig 5 with a positioning pin. In FIGS. 12(a)-(e), only elements substantially relevant to the fourth invention are shown, and others (e.g., internal electrodes, the positioning pin, etc.) are not shown for simple illustration.

Figure 13A:
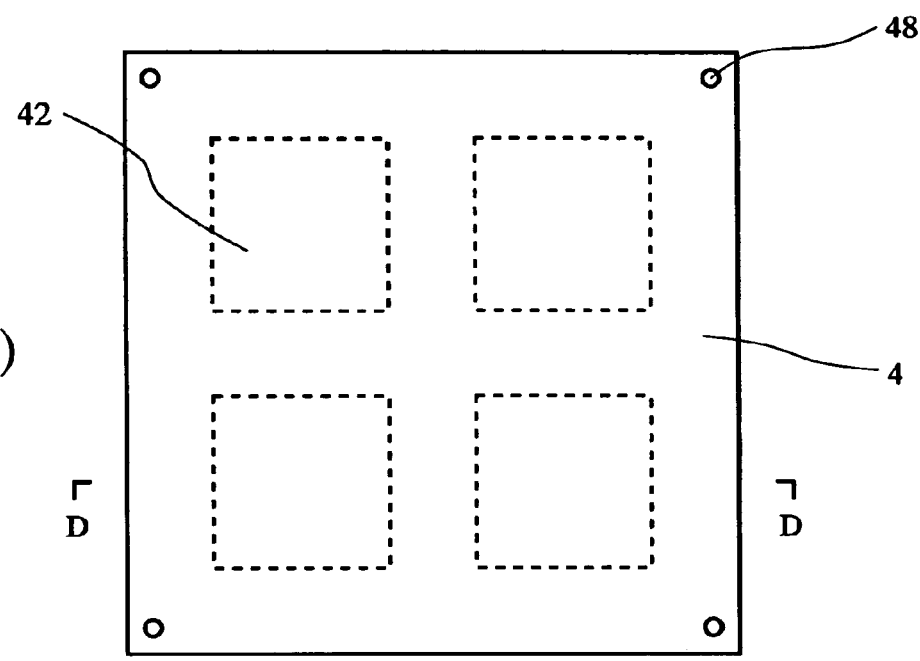
FIG. 13(a) and FIG. 13(b) are a plan view and a sectional view, respectively, of still another step-forming mask of the present invention.
Figure 13B:
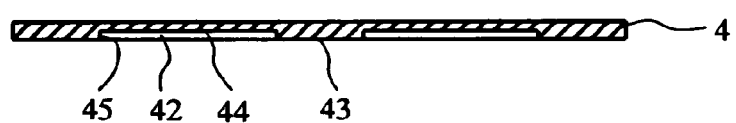
Figure 14:
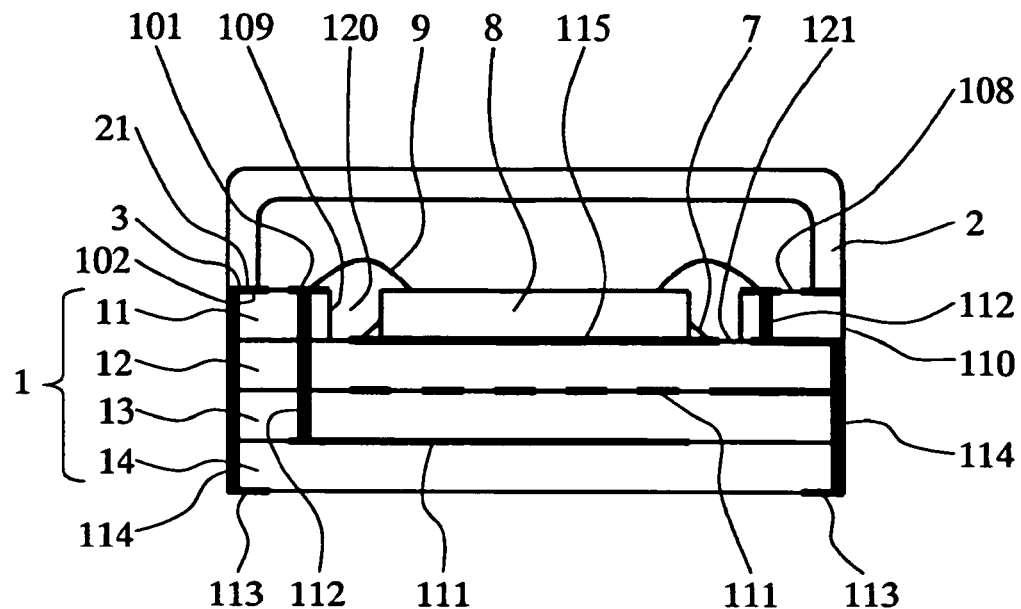
FIG. 14 is a sectional view of an antenna duplexer including a ceramic package of conventional example 1.
Figure 15:
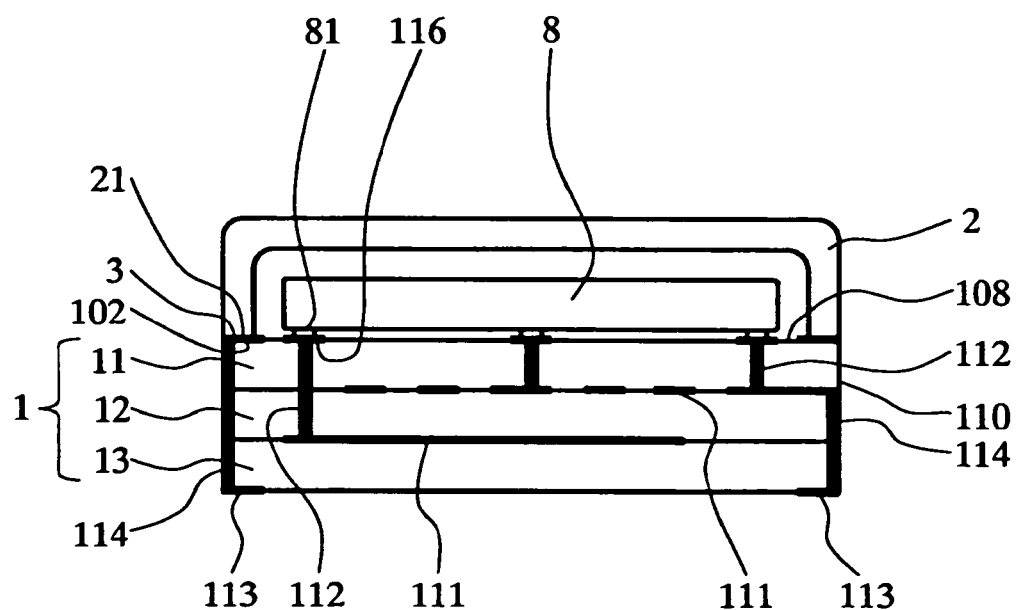
FIG. 15 is a sectional view of an antenna duplexer including a ceramic package of conventional example 2.
Figure 16A:
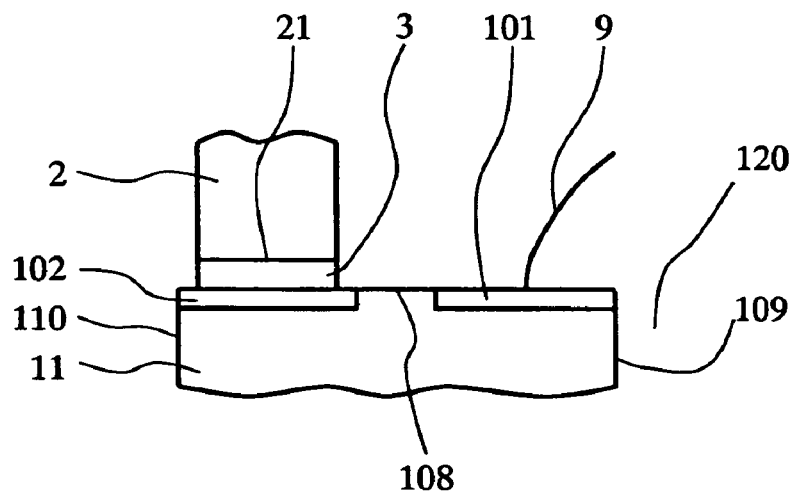
FIG. 16(a) and FIG. 16(b) are enlarged views of a cutout portion illustrating sealing of a lid to the ceramic package of conventional example 1.
Figure 16B:
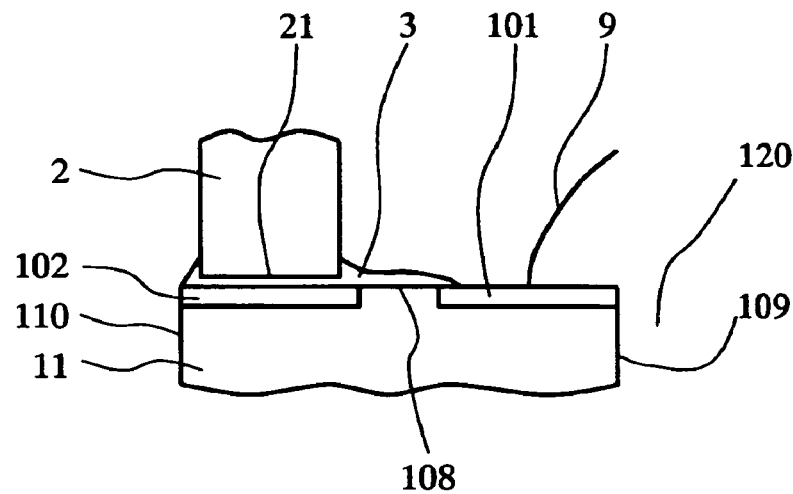
Figure 17A:
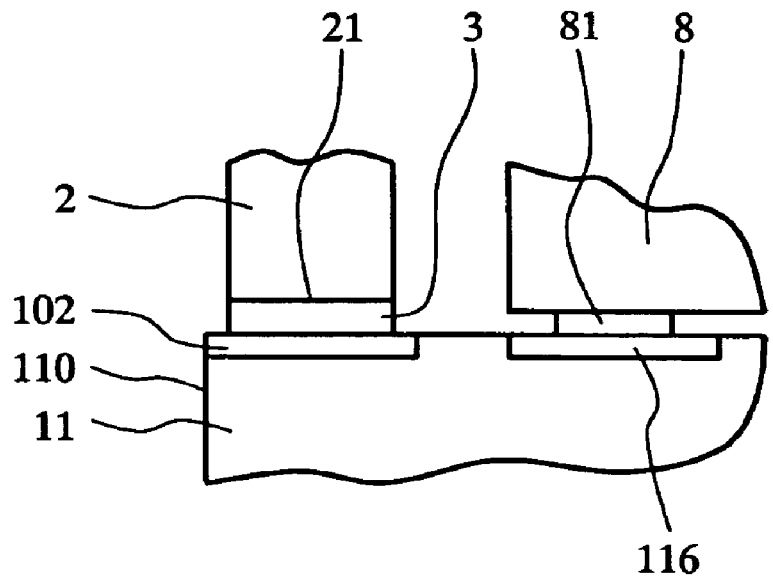
FIG. 17(a) and FIG. 17(b) are enlarged views of a cutout portion illustrating sealing of a lid to the ceramic package of conventional example 2.
Figure 17B:
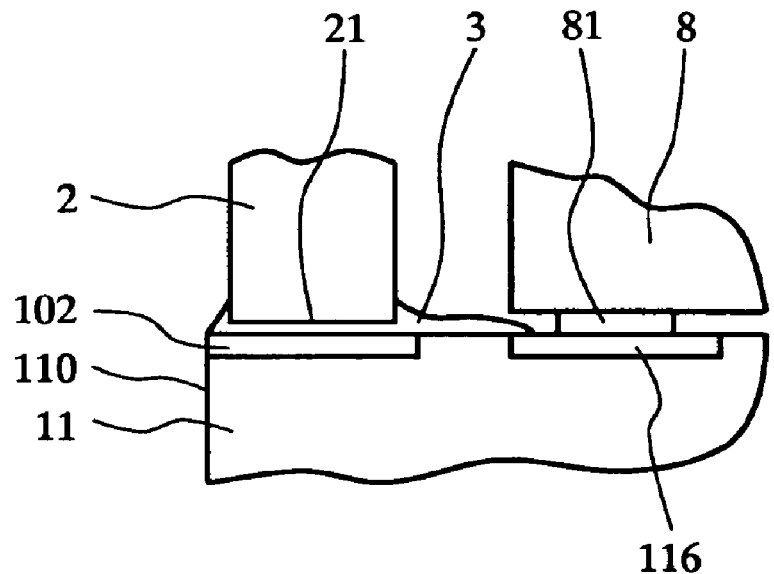

Next follows the pressing and integrating step of the fourth invention. Here, a step-forming mask 4 is prepared for ultimately forming a step on an upper surface of a ceramic package. FIG. 13(a) is a plan view of the step-forming mask 4, and FIG. 13(b) is a sectional view showing the step-forming mask 4 cut along a line D-D. The elastic step-forming mask 4 made from stainless steel has a recess 42 with a generally flat bottom surface 44 and a positioning hole 48 through which the positioning pin of the laminate jig 5 passes. The recess 42 is for forming a portion to be an inner portion of an upper surface of a fired ceramic package part. The step-forming mask 4 has an overall thickness of 0.2 mm, and the recess 42 has a depth of 0.07 mm.

As shown in FIG. 12(b), the positioning pin of the laminate jig 5 is made to pass through the positioning hole 48 (not shown) of the step-forming mask 4, and thereby the step-forming mask 4 is positioned and fixed at a given location of the non-pressed body 16. Then, the non-pressed body 16, the step-forming mask 4, and the laminate jig 5 are sandwiched so as to be covered using an elastic member such as silicon rubber (for preventing a vacuum pack from exploding, not shown). Further, the non-pressed body 16 is placed in a vacuum-packing bag (not shown) and vacuum-packed to obtain a vacuum-packed body. The vacuum-packed body is dipped in given warm water, and the non-pressed body 16 is heated and softened by the warm water. Next, hydrostatic pressure is applied in the warm water at a given pressing pressure and time. The hydrostatic pressure is uniformly applied to the non-pressed body through the step-forming mask 4, the laminate jig 5, and the elastic member, as indicated by arrows shown in FIG. 12(c), and each of the green sheets is compressed and integrated to form a ceramic laminated body 17.

FIG. 12(d) shows the ceramic laminated body 17 obtained after cooled and the vacuum pack is opened. As seen in the drawing, the ceramic laminated body 17 after pressed and integrated has an upper surface in a shape corresponding to the step-forming mask 4 because the upper surface of the non-pressed body 16, which has been in contact with the step-forming mask 4, is pressured in a softened condition.

Specifically, surfaces 43, 44, 45 of the step-forming mask 4 shown in FIG. 13(b) form an outer portion 108c, an inner portion 108d, and a stepped side wall 103a, respectively, of an upper surface of each ceramic part 1B of the ceramic laminated body 17 shown in FIG. 12(d), and the inner portion 108d projects relative to the outer portion 108c.

Following steps are based on a known manufacturing method, and therefore not described in detail. This ceramic laminated body 17 has a break groove 190 formed at a given location (dot line) with a cutter edge cutting machine or a dicer, and is fired and plated to complete a ceramic package assembled substrate 1A shown in FIG. 12(e). As seen in FIG. 12(e), each ceramic package part 1B has an upper surface formed with an outer portion 108a, an inner portion 108b, and a stepped side wall 103, corresponding to the outer portion 108c, the inner portion 108d, and the stepped side wall 103a, respectively, of FIG. 12(d).

Embodiments of the present invention are specifically described by way of examples, but the present invention is not limited to these examples. For example, an inner portion having either a wire bonding pad or a flip-chip mounting pad is described as an example, but the present invention is not limited to this and can of course be applied to that having both a wire bonding pad and a flip-chip mounting pad. Moreover, the electronic component is not limited to a surface acoustic wave filter device, and may be a crystal oscillator, which provides the same effect.

Furthermore, when a lid needs no shield function, an outer portion of the ceramic package need not have a sealing electrode because the lid need not be connected to ground. Accordingly, sealing may be made by directly bonding the lid to a ceramic package base material using a bond or the like as a sealing member. In other words, a ceramic package may be possible having an outer portion without an electrode made from a conductive material such as a sealing electrode. Supposing that the bond flows and reaches to a wire bonding portion, a bonding wire is likely to break or separate from a wire bonding pad under stress on the bonding wire due to an expansion and shrinkage of the bond caused by temperature variations in an end product such as a portable telephone. However, providing a step of the present invention can prevent the break and separation.

What is claimed is:

1. A ceramic package comprising one or more ceramic layers, wherein one single ceramic layer of said one or more ceramic layers has a surface thereof provided with a pad, and formed with a stepped side wall for preventing a sealing member located on a peripheral border from flowing towards and contacting towards the pad on the surface of the one single ceramic layer;

the surface of the one single ceramic layer being divided into an inner portion having the pad and an outer portion with the stepped side wall as the peripheral border, and one of the inner portion and the outer portion projects relative to the other.

2. The ceramic package according to claim 1, wherein the outer portion has a sealing electrode for joining a lid through the sealing member.

3. A ceramic package assembled substrate comprising ceramic package parts being the ceramic package of claim 1 connected two-dimensionally.

* * * * *